United States Patent
Speyer et al.

(10) Patent No.: US 6,611,477 B1
(45) Date of Patent: Aug. 26, 2003

(54) BUILT-IN SELF TEST USING PULSE GENERATORS

(75) Inventors: Gil A. Speyer, Los Angeles, CA (US); David L. Ferguson, Beaconsfield (CA); Daniel Y. Chung, Fremont, CA (US); Robert D. Patrie, Scotts Valley, CA (US); Robert W. Wells, Cupertino, CA (US); Robert O. Conn, Los Gatos, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 10/132,419

(22) Filed: Apr. 24, 2002

Related U.S. Application Data

(62) Division of application No. 09/244,753, filed on Feb. 5, 1999, now Pat. No. 6,466,520, which is a continuation-in-part of application No. 09/083,892, filed on May 21, 1998, now Pat. No. 6,005,829, which is a continuation of application No. 09/710,465, filed on Sep. 17, 1996.

(51) Int. Cl.$^7$ .............................. G04F 8/00; G08B 1/08; G01R 31/317; G06F 11/00

(52) U.S. Cl. ................... 368/113; 368/118; 368/120; 324/617; 324/763; 324/765; 714/733

(58) Field of Search ................... 368/113, 118, 368/120; 324/73 R, 73.1, 617, 763, 765; 714/724, 733–736, 738

(56) References Cited

U.S. PATENT DOCUMENTS

| | | | |
|---|---|---|---|
| 3,603,746 A | 9/1971 | Helck | |
| 3,843,938 A | 10/1974 | Bergman | |
| 4,510,429 A | 4/1985 | Squire | |
| 4,691,121 A | 9/1987 | Theus | |
| 4,792,932 A | 12/1988 | Bowhers et al. | |
| 4,795,964 A | 1/1989 | Mahant-Shetti et al. | |
| 4,857,868 A | 8/1989 | Robb | |
| 4,878,209 A | 10/1989 | Bassett et al. | |
| 4,890,270 A | 12/1989 | Griffith | |
| 5,048,064 A | 9/1991 | Rutherford | |
| 5,083,299 A | 1/1992 | Schwanke et al. | |
| 5,097,208 A | 3/1992 | Chiang | |
| 5,181,191 A | 1/1993 | Farwell | |
| RE34,363 E | 8/1993 | Freeman | |

(List continued on next page.)

OTHER PUBLICATIONS

"The Programmable Logic Data Book", 1998, available from Xilinx, Inc. 2100 Logic Drive, San Jose, CA. 95124, pp. 4–5 to 4–40.

Application Note from Xilinx, Inc., "Efficient Shift Registers, LFSR Counters, and Long Pseudo–Random Sequence Generators" by Peter Alfke, Jul. 7, 1996.

"Signal Delay in RC Tree Networks" IEEE Transaction on Computer–Aided Design, vol. CAD–2, No. 3, Jul. 1983, pp. 202–211.

*Primary Examiner*—Vit Miska
(74) *Attorney, Agent, or Firm*—Arthur J. Behiel; Edel M. Young

(57) ABSTRACT

A circuit measures the signal propagation delay through a selected test circuit. The test circuit is provided with a feedback path so that the test circuit and feedback path together form a free-running oscillator. The oscillator then automatically provides its own test signal that includes alternating rising and falling signal transitions on the test-circuit input node. A phase discriminator samples the output of the oscillator and accumulates data representing the signal propagation delay of either rising or falling signal transitions propagating through the test circuit. The worst-case delay associated with the test circuit can then be expressed as the longer of the two. Knowing the precise worst-case delay allows IC A designers to minimize the guard band and consequently guarantee higher speed performance.

17 Claims, 4 Drawing Sheets

U.S. PATENT DOCUMENTS

| | | |
|---|---|---|
| 5,294,559 A | 3/1994 | Malhi |
| 5,351,211 A | 9/1994 | Higeta et al. |
| 5,422,585 A | 6/1995 | Fan Chiangi et al. |
| 5,457,400 A | 10/1995 | Ahmad et al. |
| 5,581,738 A | 12/1996 | Dombrowski |
| 5,606,567 A | 2/1997 | Agrawal et al. |
| 5,625,288 A | 4/1997 | Snyder et al. |
| 5,818,250 A | 10/1998 | Yeung et al. |
| 5,845,233 A | 12/1998 | Fishburn |
| 5,923,676 A | 7/1999 | Suntter et al. |
| 5,929,684 A | 7/1999 | Daniel |
| 5,973,976 A | 10/1999 | Sato |
| 6,057,691 A | 5/2000 | Kobayashi |
| 6,219,305 B1 * | 4/2001 | Patrie et al. ............ 368/113 |
| 6,356,514 B1 * | 3/2002 | Wells et al. ............ 368/113 |

* cited by examiner

BUILT-IN SELF TEST USING PULSE GENERATORS

CROSS REFERENCE TO RELATED APPLICATIONS

This application is a divisional of U.S. patent application Ser. No. 09/244,753 filed Feb. 5, 1997, U.S. Pat. No. 6,466,520, which is a continuation-in-part of U.S. Pat. No. 6,005,829, entitled "Method For Characterizing Interconnect Timing Characteristics," by Robert O. Conn, issued Dec. 21, 1999. This application is related to U.S. Pat. No. 6,233,205, entitled "Built-In Self Test Method For Measuring Clock to Out Delays," by Robert W. Wells, Robert D. Patrie; and Robert O. Conn, issued May 15, 2001. This application is related to U.S. Pat. No. 6,219,305, entitled "Method and System for Measuring Signal Propagation Delays Using Ring Oscillators," by Robert W. Wells, and Robert D. Patrie, et al., issued Apr. 17, 2001; and U.S. Pat. No. 6,069,849, entitled "Method and System For Measuring Signal Propagation Delays Using the Duty Cycle of a Ring Oscillator," by Christopher H. Kingsley, Robert W. Wells, Robert D. Patrie, and Robert O. Conn, issued May 30, 2000. The contents of these related cases are incorporated herein by reference.

FIELD OF THE INVENTION

This invention relates generally to methods and circuit configurations for measuring signal propagation delays, and in particular for measuring signal propagation delays through data paths of integrated circuits.

BACKGROUND

Integrated circuits (ICs) are the cornerstones of myriad computational systems, such as personal computers and communications networks. Purchasers of such systems have come to expect significant improvements in speed performance over time. The demand for speed encourages system designers to select ICs that guarantee superior speed performance. This leads IC manufactures to carefully test the speed performance of their designs.

FIG. 1 depicts a conventional test configuration 100 for determining the signal propagation delay of a test circuit 110 in a conventional IC 115. A tester 120 includes an output lead 125 connected to an input pin 130 of IC 115. Tester 120 also includes an input line 135 connected to an output pin 140 of IC 115.

Tester 120 applies an input signal to input pin 130 and measures how long the signal takes to propagate through test circuit 110 from input pin 130 to output pin 140. The resulting time period is the timing parameter for test circuit 110, the path of interest. Such parameters are typically published in literature associated with particular ICs and/or used to model the speed performance of circuit designs that employ the path of interest.

Conventional test procedures are problematic for at least two reasons. First, many signal paths within a given IC are not directly accessible via input and output pins, and therefore cannot be measured directly. Second, testers have tolerances that can have a significant impact on some measurements, particularly when the path of interest is short. For example, if a tester accurate to one nanosecond measures a propagation delay of one nanosecond, the actual propagation delay might be any time between zero and two nanoseconds. In such a case the IC manufacturer would have to assume the timing parameter was two nanoseconds, the worst-case scenario. If ICs are not assigned worst-case values, some designs will fail. Thus, IC manufacturers tend to add relatively large margins of error, or "guard bands," to ensure that their circuits will perform as advertised. Unfortunately, this means that those manufacturers will not be able to guarantee their full speed performance, which could cost them customers in an industry where speed performance is paramount.

Programmable logic devices (PLDS) are well-known digital integrated circuits that may be programmed by a user (e.g., a circuit designer) to perform specified logic functions. One type of PLD, the field-programmable gate array (FPGA), typically includes an array of configurable logic blocks (CLBs) that are programmably interconnected to each other and to programmable input/output blocks (IOBs). This collection of configurable logic is configured by loading configuration data into internal configuration memory cells that define how the CLBs, interconnections, and IOBs are configured.

Each programming point, CLB, interconnection line, and IOB introduces some delay into a signal path. The many potential combinations of delay-inducing elements make timing predictions particularly difficult. FPGA designers use "speed files" that include resistance and capacitance values for the various delay-inducing elements and combine them to establish delays for desired signal paths. These delays are then used to predict circuit timing for selected circuit designs implemented as FPGA configurations. FPGA timing parameters are assigned worst-case values to ensure FPGA designs work as indicated.

Manufacturers of ICs, including FPGAs, would like to guarantee the highest speed performance possible without causing ICs to fail to meet the guaranteed timing specifications. More accurate measurements of circuit timing allow IC designers to use smaller guard bands to ensure correct device performance, and therefore to guarantee higher speed performance. There is therefore a need for a more accurate means of characterizing IC speed performance.

SUMMARY

The present invention addresses the need for an accurate means of characterizing IC speed performance. The inventive circuit is particularly useful for testing programmable logic devices, which can be programmed to include both the signal path of interest and a majority of the requisite test circuitry.

In accordance with the invention, a test circuit (e.g., a signal path selected for analysis) is provided with a feedback path so that the test circuit and feedback path together form a free-running oscillator. The oscillator then automatically provides its own test signal that includes alternating rising and falling signal transitions, or edges, on the test-circuit input node. To establish the average period of the oscillator, these signal transitions are counted over a predetermined time period, or the time period for a predetermined large count is measured. This average period is then related to the average signal propagation delay through the test circuit.

Signal paths often exhibit different propagation delays for falling and rising edges, due to imbalanced driver circuits, for example. The trouble with providing average propagation delays is that the worst-case delay is generally greater than the average delay. Consider, for example, the case where a signal path delays falling edges by 2 nanoseconds and rising edges by 3 nanoseconds. The average, 2.5 nanoseconds, is shorter than the worst-case delay associated with rising edges. Unfortunately, the average delay does not indicate whether the delays associated with falling and rising edges are different. Thus, a conservative guard band must be added to the average delay.

The present invention reduces the requisite guard band by separately measuring the signal propagation delays associated with rising and falling edges traversing the test circuit. The oscillator includes a phase detector with an output node connected to a pulse generator, or one-shot. The phase detector also has an in put node connected to the output node of the pulse generator through the test circuit so that the phase detector, pulse generator, and test circuit form a closed loop.

The pulse generator sends test pulses through the test-circuit to the phase detector. The phase detector responds to either the high-to-low or low-to-high signal transitions of each test pulse from the test circuit by causing the pulse generator to generate the subsequent test pulse; the phase detector ignores the other type of signal transition. The loop oscillates at a frequency that is determined by the signal propagation delay associated with only one type of signal transition because the phase discriminator initiates pulses in response to only one type of signal transition. The signal propagation delay for the selected type of signal transition can then be calculated from the oscillation frequency.

In one embodiment the phase discriminator includes selective inverters that enable the closed loop to oscillate at a frequency determined by the signal propagation time for either rising or falling edges propagating through the test circuit. The worst-case delay associated with the test circuit is simply the longer of the-two delays. Knowing the precise worst-case delay allows IC designers to minimize the guard band and consequently guarantee higher speed performance.

DETAILED DESCRIPTION

Figure 1:
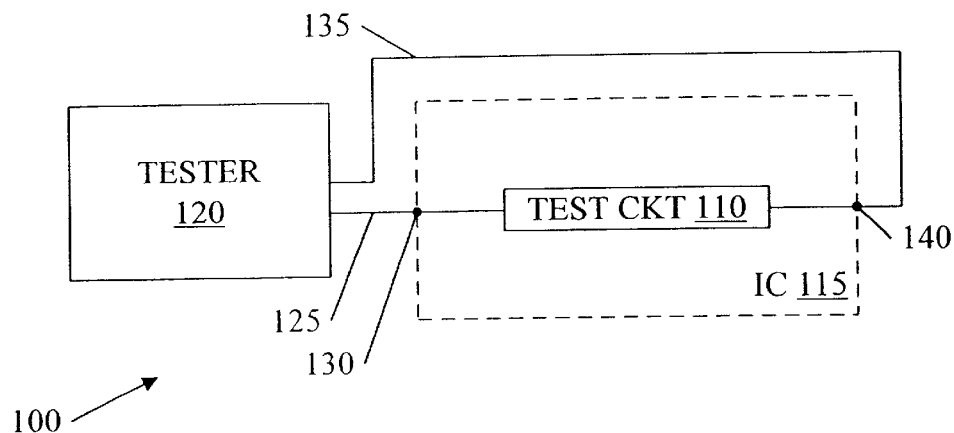
FIG. 1 depicts a conventional test configuration 100 for determining the signal propagation delay of a test circuit 110 in a conventional IC 115.
Figure 2:
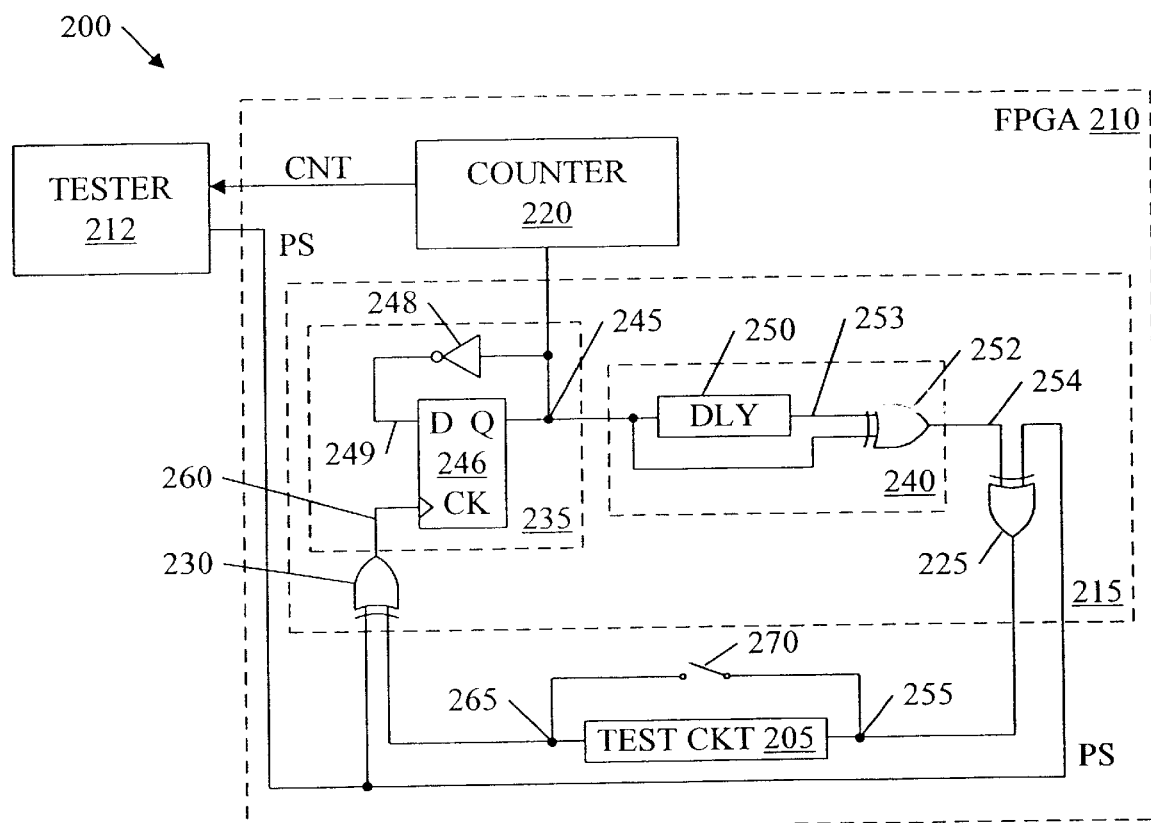
FIG. 2 depicts a system 200 adapted to separately measure the signal propagation delays associated with rising and falling signal transitions through a test circuit 205.

FIG. 2 depicts a system 200 adapted to separately measure the signal propagation delays associated with rising and falling signal transitions through a test circuit 205. Measuring the delays separately is important because signal paths often exhibit different propagation delays for falling and rising edges, due to imbalanced driver circuits, for example.

In accordance with the present invention, FPGA 210 is connected to a conventional tester 212 and is configured to include a phase discriminator 215 that distinguishes between rising and falling edges. FPGA 210 also includes a conventional binary counter 220 and a test-circuit bypass switch 270. Phase discriminator 215 includes a phase detector 235, a pair of XOR gates 225 and 230, and a pulse generator 240. Phase detector 235, pulse generator 240, and counter 220 connect to one another at a common node 245. Phase detector 235, pulse generator 240, XOR gate 225, test circuit 205, and XOR gate 230 form a closed delay path. Counter 220 may instead be connected elsewhere along this delay path.

Phase detector 235 includes a D flip-flop 246 that conventionally includes a "D" input (line 249), a "Q" output (node 245), and a clock terminal CK (node 260). Flip-flop 246 is positive-edge triggered, and therefore ignores falling edges on node 260. An inverter 248 connected between node 245 and a line 249 causes flip-flop 246 to alternate the logic level provided on node 245 each time flip-flop 246 receives a rising clock edge on node 260.

Pulse generator 240 includes a delay element 250 that, in response to each signal transition on node 245, produces a corresponding delayed signal transition on a line 253. Lines 245 and 253 are connected to respective input terminals of an XOR gate 252. XOR gate 252 performs an exclusive OR function on the signal on node 245 and the corresponding delayed signal on line 253 to produce a clock pulse on line 254 for each signal transition on node 245. Pulse generator 240 is effectively a one-shot that produces pulses in response to either rising or falling edges on node 245.

Node 245 is one output node of phase discriminator 215. A second output node, from XOR gate 225, connects to an input node 255 of test circuit 205. Phase discriminator 215 also includes an input node 260 connected via XOR gate 230 to an output node 265 of test circuit 205.

The presence of a logic one on phase-select line PS causes each of XOR gates 225 and 230 to function as an inverter. Conversely, a logic zero on the inputs of XOR gate 225 and 230 causes them to function as buffers. For this reason, XOR gates 225 and 230 may be thought of as "selective inverters." As explained below in connection with FIG. 3, the use of selective inverters 225 and 230 allows tester 212 to select which phase is being tested by selecting whether rising or falling edges control the traverse of test circuit 205 and clock phase detector 235.

Tester 212 determines whether the signal propagation delay being measured is for rising or falling edges by providing the appropriate logic level on phase-select line PS. Once the desired phase is selected, phase discriminator 215 and test circuit 205 function as a ring oscillator in which the period of oscillation is determined by the signal propagation delay of the selected type of signal transition through test circuit 205. For example, if the falling-edge delay $D_F$ through test circuit 205 is of interest, the signal on phase-select line PS is brought high, causing XOR gate 225 to invert the signal on line 254 so that phase discriminator 215 outputs an oscillating signal on node 245, and the period $T_F$ is determined by the falling-edge delay $D_F$ through test circuit 205. Counter 220 counts the number of these transitions over a test period $T_{TEST}$ defined by tester 212 and passes the count to tester 212 via a count bus CNT. Tester 212 then calculates the signal propagation delay through test circuit 215 by dividing the test period $T_{TEST}$ by twice the count.

Figure 3B:
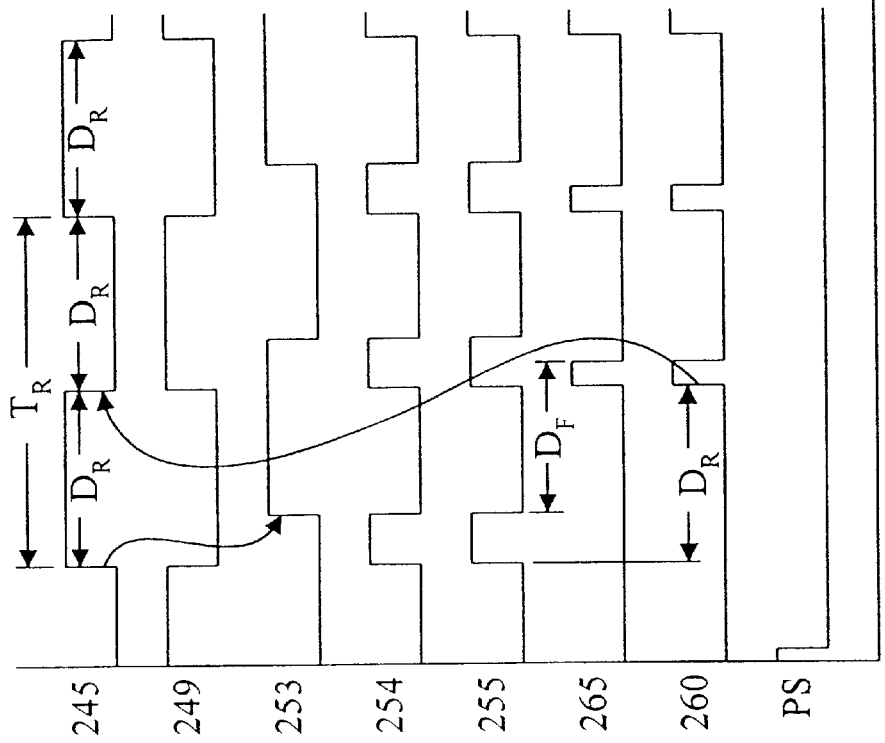
FIGS. 3A and 3B are simple waveform diagrams depicting the operation of system 200 of FIG. 2.
Figure 3A:
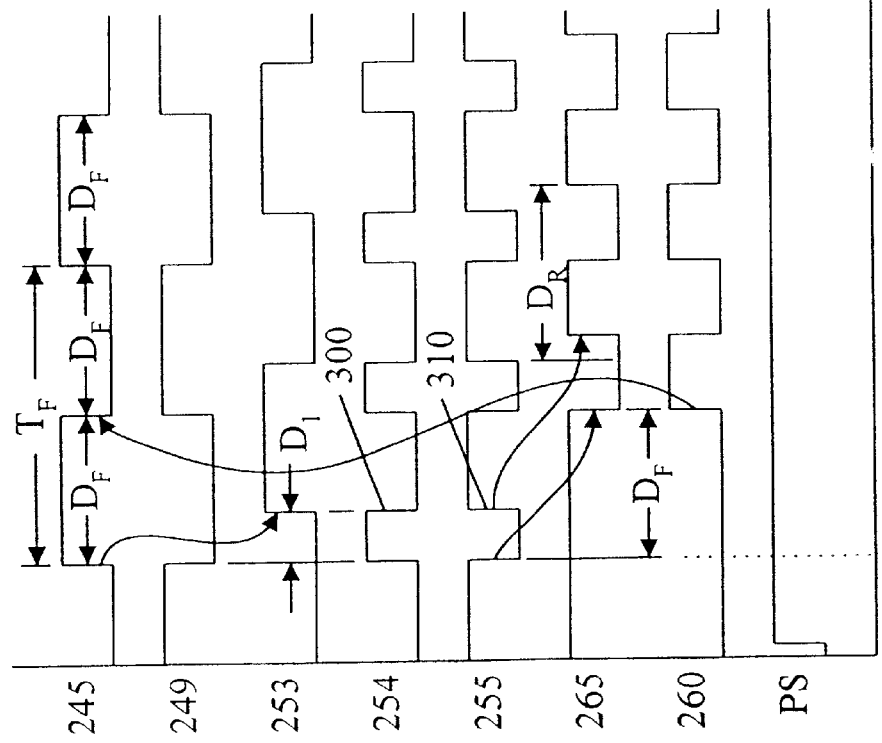

FIGS. 3A and 3B are simple waveform diagrams depicting the operation of system 200 of FIG. 2: FIG. 3A depicts the operation of system 200 when measuring the falling-edge delay $D_F$ for falling edges traversing test circuit 205; FIG. 3B depicts the operation of system 200 when measuring the rising-edge delay $D_R$ for rising edges traversing test circuit 205. Each waveform in FIGS. 3A and 3B is labeled using the corresponding node numbers depicted in FIG. 2. The node designations are hereafter used to alternately refer to circuit nodes or their corresponding signals. In each instance, the interpretation of the node designations as either-signals or physical elements will be clear from the context.

Referring first to FIG. 3A, it can be seen that phase select line PS is set to a logic one; thus, XOR gates 225 and 230 invert the respective signals on nodes 254 and 265. A test-enable signal (not shown) from tester 212 initiates the delay measurement by clocking flip-flop 246, and thereby causing signal 245 to rise to a logic one at time $T_1$. Appropriate test-enable circuitry is described below in connection with FIG. 4.

Pulse generator 240 generates a pulse 300 each time a rising edge on node 260 clocks flip-flop 246. XOR gate 252 creates the pulse by performing an exclusive OR function of the signal on node 245 and a delayed version of the same signal on node 253. That is, when node 245 first goes high, the output of XOR gate 252 goes high; then, when the delayed version of the high logic level traverses delay element 250, XOR gate 252 responds to the two high logic levels on nodes 253 and 245 by returning node 254 to a logic zero. Delay element 250, having a delay Dl, determines the width of the pulse. XOR gate 225 then inverts pulse 300 because phase-select line PS caries a logic one. The resulting inverted pulse 310 passes, through test circuit 205 to output node 265.

The signal on node 265 is a delayed version of the signal on node 255. In the illustrated examples of FIGS. 3A and 3B, falling-edge delay $D_F$ is shorter than rising-edge delay $D_R$. This illustrates the possibility of rising and falling edges experiencing different-amounts of delay. In other examples, the rising-edge delay $D_R$ might be-shorter than the falling-edge delay $D_R$, or the two delays might be identical.

XOR gate 230 inverts the signal on node 265 and presents the inverted signal to the clock input of flip-flop 246. Flip-flop 246 clocks on the rising edge of the signal on node 260, transferring the signal on node 249 (presently a logic zero) to node 245. This signal transition on node 245 instigates a second pulse from pulse generator 240 and the process begins again. Thus, the combination of phase discriminator 215 and test circuit 205 functions as a ring oscillator-to generate the test signal on node 245.

The period $T_F$ of the signal on node 245 is determined by falling-edge delay $D_F$, and is independent of rising-edge delay $D_R$. In particular, the period $T_F$ is approximately equal to two times the falling-edge delay $D_F$ (i.e., $T_F=2D_F$). This relationship advantageously allows tester 212 to determine the falling-edge delay $D_F$ with great precision.

Recall that counter 220 counts the number of periods $T_F$ that occur over a given test period $T_{TEST}$ and outputs the number as a variable CNT. Obtaining the average period $T_F$ is a simple matter of dividing the test period $T_{TEST}$ by the variable CNT (i.e., $T_F=T_{TEST}/CNT$). Substituting $2D_F$ for $T_F$ and dividing both sides by two gives:

$$D_F=T_{TEST}/2CNT \qquad (1)$$

The forgoing analysis ignores the delay associated with phase discriminator 215. More accurate delay measurements can be created by accounting for this delay. This can be accomplished, for example, by obtaining a delay measurement that excludes test circuit 205 by closing bypass switch 270 and performing the delay measurement as described above. The resulting delay is then subtracted from the results obtained when test circuit 205 is tested (i.e., with bypass switch 270 open) to obtain the delay attributable to test circuit 205.

The waveforms of FIG. 3B are substantially the same as those of FIG. 3A. However, phase-select line PS is set to a logic zero so that each of XOR gates 225 and 230 do not invert the respective signals on nodes 254 and 265. As a result, phase discriminator 215 develops an output signal on node 245 that has a period $T_R$ determined by rising-edge delay $D_R$ imposed by test circuit 205 on rising edges, and is independent of falling-edge delay $D_F$. The math is the same as discussed above in connection with FIG. 3A, except that dividing the test period $T_{TEST}$ by twice the count signal CNT provides rising-edge delay $D_R$ when phase-select signal PS is a logic zero. Expressed mathematically, $$D_R=T_{TEST}/2CNT \qquad (2)$$

Figure 4:
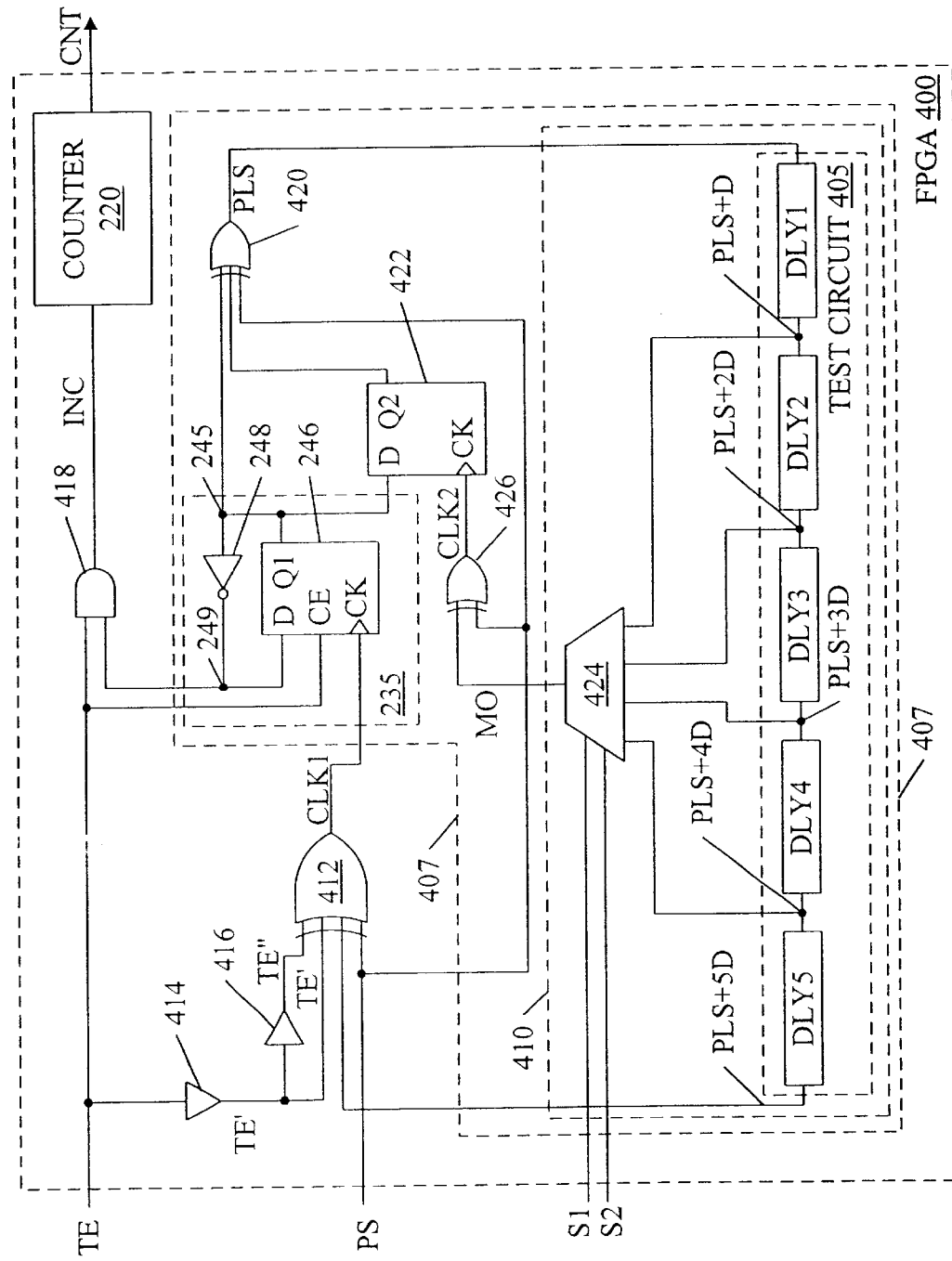
FIG. 4 is a schematic diagram of an FPGA 400 configured to include circuitry for separately measuring rising-edge delay $D_R$ and falling-edge delay $D_F$ through a test circuit 405.

FIG. 4 is a schematic diagram of an FPGA 400 configured, in accordance with another embodiment of the invention, to include circuitry for separately measuring rising-edge delay $D_R$ and falling-edge delay $D_F$ through a test circuit 405. FPGA 400 functions in much the same way as FPGA 200 of FIG. 2, the major difference between the two configurations being that pulse generator 240 of FIG. 2 includes a fixed delay element 250 to define the pulse width $D_1$, whereas the pulse generator 407 includes a variable delay element 410 that allows a user (or software) evaluating the speed performance of FPGA 400 to select from among various pulse widths. This flexibility is important, for example, for testing circuitry in which the delay associated with rising edges is significantly greater or less than that associated with falling edges. If the pulse output by the pulse generator is too short, the falling edge could catch the rising edge, causing the oscillator to stop. Similar errors can occur for test circuitry in which the delay associated with falling edges is significantly greater than that associated with rising edges. The circuit of FPGA 400 allows a user to optimize the pulse width to forestall such problems.

FPGA 400 is connected to a conventional tester (not shown) via a test-enable line TE, a phase-select line PS, a pair of multiplexer select lines S1 and S2, and a count line CNT. The tester determines whether the signal propagation delay being measured is for rising or falling edges (i.e., low-to-high or high-to-low logic transitions) by providing the appropriate logic level on a phase-select line PS. The tester then initiates a test by asserting the test-enable signal TE.

Test-enable line TE is connected to one input terminal TE' of a four-input XOR gate 412 by a buffer 414 and to another input TE" by buffer 414 connected in series with a second buffer 416. The output terminal of XOR gate 412 connects to a phase detector 235 via a clock-line CLK1. Phase detector 235 is identical to the like-numbered circuit of FIG. 2, and includes a conventional D flip-flop 246 with a conventional inverter 248 connected between node 245 and the D input of flip-flop 246. The output terminal of inverter 248 connects to an input terminal of an AND gate 418 via a line 249. AND gate 418 has a second input connected to test-enable line TE and an output connected to counter 220 via an increment line INC. Counter 220 is equivalent to the like-numbered element of FIG. 2.

Output node Q1 of flip-flop 246 connects to both an input terminal of an XOR gate 420 and a D input terminal of a second flip-flop 422. The remaining two input terminals of XOR gate 420 connect to the Q output terminal Q2 of flip-flop 422 and the phase-select line PS, respectively. The output node of XOR gate 420 then connects to test circuit 405 via a line PLS. Line PLS is so designated because it carries a pulse during operation.

Test circuit 405 is depicted as including five separate delay elements DLY1 to DLY5 separated by nodes connected to input terminals of multiplexer 424. Delay elements DLY1 to DLY5 are simply portions of the device under test (test circuit 405) that are serving as convenient delay points. Multiplexer 424 may have more or fewer input terminals, depending upon the level of delay granularity desired for a particular application. Further, dedicated delay elements may also be used. That is, a delay path not part of the test path may be formed between line PLS and an input to multiplexer 424.

Delay elements DLY1 to DLY5 include output nodes with increasing amounts by which the corresponding signal is delayed with respect to the pulse signal PLS.

Each of the four nodes separating adjacent pairs of delay elements DLY1 to DLY5 connects to a corresponding input terminal of a multiplexer 424. The logic levels on select inputs S1 and S2 then determine which of the delay nodes is connected to an input terminal of an XOR gate 426. XOR gate 426 includes a second input terminal connected to phase-select terminal PS and an output terminal connected to the clock input CK of flip-flop 422 via a line CLK2. Output terminal PLS+5D of test circuit 405 also connects to an input terminal of XOR gate 412 to complete the loop.

Figure 5:
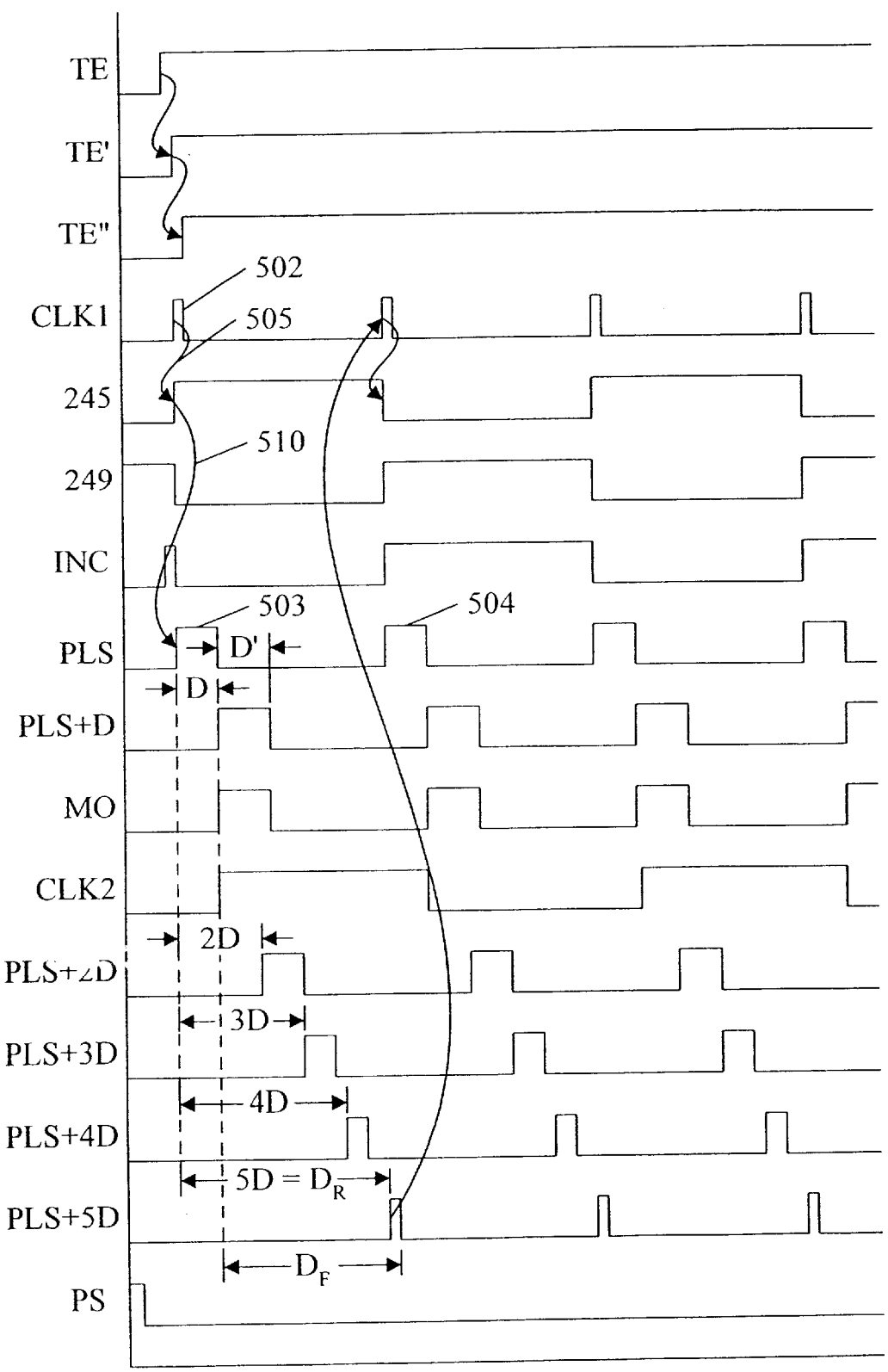
FIG. 5 is a simple waveform diagram depicting the operation of FPGA 400 of FIG. 4.

FIG. 5 is a waveform diagram depicting the operation of FPGA 400 of FIG. 4. Each waveform in FIG. 5 is labeled using the corresponding node (e.g., line or terminal) designation depicted in FIG. 4. The node designations are hereafter used to alternatively refer to circuit nodes or their corresponding signals. In each instance, the interpretation of the node designations as either signals or physical elements will be clear from the context.

The test begins when the tester (not shown) asserts test-enable signal TE, which enables flip-flop 246 and prepares AND gate 418 to convey signals from flip-flop 246 to counter 220. Buffers 414 and 416 output a pair of test-enable signals TE' and TE" to XOR gate 412 in response to test-enable signal TE. XOR gate 412 performs an exclusive OR function of test-enable signals TE' and TE" to provide a clock pulse 502 on line CLK1. The rising edge of the clock pulse on line CLK1 clocks flip-flop 246, transferring the signal on line 249 (presently a logic one) to node 245 (arrow 505). The rising edge on output node 245 causes pulse-generator output signal PLS to transition to a logic one (arrow 510). Test-enable signal TE' can be derived from test-enable signal TE, as shown in FIG. 4, or can be a separate control signal.

The rising edge of pulse-generator output signal PLS traverses five delay elements DLY1 to DLY5 and XOR 412 before clocking flip-flop 246 to initiate a subsequent pulse. Flip flop 246 clocks on rising edges, so pulse-generator output signal PLS must be brought low after each rising edge to prepare flip-flop 246 for a subsequent rising edge. Multiplexer 424, XOR gate 426, and flip flop 422 accomplish this task and provide a selectable pulse width. When pulse PLS has propagated through a selected number of delay elements DLY1 through DLY5, multiplexer 424 applies a delayed version of this signal to XOR gate 426, generating clock signal CLK2, which in turn causes flip flop 422 to propagate the signal on node 245 to XOR gate 420, causing XOR gate 420 to change the state of line PLS. If multiplexer 424 has selected line PLS+D, the pulse duration on line PLS will be short, while if multiplexer 424 has selected line PLS+5D, the pulse duration on line PLS will be longer. The state changes regardless of whether phase select signal PS is high or low.

If PS is low, a high signal at Q1 will initially cause a high PLS signal to be provided by XOR gate 420. When this high signal propagates through multiplexer 424 and XOR gate 426, the high CLK2 signal will cause flip flop 422 to pass the high signal on node 245 to XOR gate 420, which in response to two high signals and a low signal will output a low PLS signal. When this low signal propagates to CLK2, no change will occur in flip flop 422. The PLS output signal from XOR gate 420 will remain low until the high signal on line PLS+5D has propagated through XOR gate 412, causing XOR gate 412 to output a high CLK1 signal (since in a steady state TE'=TE" and PS is low, XOR gate 412 does not invert). The high CLK1 signal causes flip-flop 246 to propagate the low signal on line 249 to Q1. The low signal on node 245 in combination with the high Q2 output signal and low PS signal cause XOR gate 420 to output a high PLS signal, which remains high until flip flop 422 again provides a matching high output signal, returning the PLS signal low.

If PS is high, a switching signal at node 245 causes the PLS output signal to go low (since one of node 245 and the Q2 output of flip flop 422 is high). This PLS output signal does not switch in response to the low going CLK2 signal. But when the low PLS signal reaches XOR gate 412, the high PS signal causes CLK1 to go high, causing flip flop 246 to output a low Q1 signal on node 245, which in turn causes XOR gate 420 to briefly output a low PLS signal. When this low signal reaches XOR gate 426, XOR gate 426 outputs a high CLK2 signal, causing the low signal on node 245 to propagate to XOR gate 420. Since PS is high, XOR gate 420 again outputs a high PLS signal, which remains high until CLK1 has gone low and then high again.

By selecting the length of the pulse, circuit 410 can protect against allowing a rising edge to catch a falling edge or a falling edge to catch a rising edge.

The signal on node PLS+5D, the output of test circuit 405, is a delayed version of the signal on node PLS. Note, however, that the falling edge is delayed by a time $D_F$ that is shorter than the delay $D_R$ associated with the subsequent rising edge. Consequently, the rising edge slowly gains on the falling edge such that the pulses of signal PLS+5D are significantly shorter than the corresponding pulses of signal PLS. This case is illustrative only; the rising-edge delay $D_R$ might easily be shorter than or equal to the falling-edge delay $D_R$.

Variable delay element 410 allows the tester to select from among various pulse widths for signal PLS by applying combinations of logic signals on select terminals S1 and S2. The example of FIG. 5 assumes that rising- and falling-edge delays $D_R$ and $D_F$ are similar enough that a short delay period D, available at node PLS+D, is sufficient to ensure that the pulses on terminal PLS are not too short.

The first pulse 502 initiated when test-enable line TE is asserted causes pulse generator 407 to produce a pulse 503 that is fed back to pulse generator 407 via XOR gate 412, causing pulse generator 407 to produce yet another pulse 504. Thus, asserting test-enable signal TE starts a chain reaction that causes pulse generator 407 and XOR gate 412 to function as a ring oscillator. The frequency of the ring oscillator depends primarily on the signal propagation delay of either rising or falling edges through test circuit 405. Rising-and falling-edge delays $D_R$ and $D_F$ can therefore be calculated as described above in connection with FIGS. 2 and 3.

While the present invention has been described in connection with specific embodiments, variations of these embodiments will be obvious to those of ordinary skill in the art. For example, test circuit 205 need not be included on an FPGA, but can be any device or signal path for which the signal propagation delay is of interest. Moreover, some components are shown directly connected to one another while others are shown connected via intermediate components. In each instance the method of interconnection establishes some desired electrical communication between two or more circuit nodes or terminals. Such communication may often be accomplished using a number of circuit configurations, as will be understood by those of skill in the art. Therefore, the spirit and scope of the appended claims should not be limited to the foregoing description.

What is claimed is:

1. A method of measuring a first signal-propagation time required for a rising edge of a signal to traverse a test circuit from a data input node of the test circuit to a data output node of the test circuit, the method comprising:
   a. providing sequential, alternating falling and rising signal transitions on the test-circuit data input node, thereby producing a corresponding series of alternating falling and rising signal transitions on the test circuit data output node; and
   b. developing a clock signal having a clock period proportional to the first signal propagation time, wherein the clock period is independent of a second signal propagation time required for a falling edge of the signal to traverse the test circuit from the data input node of the test circuit to the data output node of the test circuit.

2. The method of claim 1, further comprising counting a number of clock periods over a predetermined time.

3. The method of claim 1, further comprising averaging the clock periods to arrive at an average clock period.

4. The method of claim 2, further comprising employing the average clock period to determine the first signal-propagation time required for a low-to-high signal transition to traverse the test circuit.

5. The method of claim 3, further comprising calculating a portion of the first signal propagation delay not associated with the test circuitry and subtracting the portion from the first signal propagation delay.

6. A method of measuring a first signal-propagation time required for a rising edge of a signal to traverse a test circuit from a data input node of the test circuit to a data output node of the test circuit, the method comprising:
   a. providing sequential, alternating falling and rising signal transitions on the test-circuit data input node, thereby producing a corresponding series of alternating falling and rising signal transitions on the test-circuit data output node; and
   b. for each one of a plurality of the rising signal transitions that occur on the test-circuit data output node over a selected time period:
      i. instigating a subsequent one of the rising signal transitions on the test-circuit data input node in response to the one rising signal transition; and
      ii. instigating a subsequent falling signal transition on the test-circuit data input node in response to the one rising signal transition on the test-circuit data output node.

7. The method of claim 6, further comprising developing a clock transition for each one of the plurality of the rising signal transitions that occur on the test-circuit data output node over the selected time period, thereby creating a clock signal having a clock period proportional to the first signal propagation time.

8. The method of claim 7, further comprising calculating the first signal propagation time using the clock period and the selected time period.

9. A circuit for measuring a first signal-propagation time required for a rising edge of a signal to traverse a test circuit from a data input node of the test circuit to a data output node of the test circuit, the circuit comprising:
   a. means for providing sequential, alternating falling and rising signal transitions on the test-circuit data input node, thereby producing a corresponding series of alternating falling and rising signal transitions on the test-circuit data output node; and
   b. means for instigating a subsequent rising signal transition and a subsequent falling signal transition on the test-circuit data input node in response to one rising signal transition on the test-circuit data output node.

10. A method of measuring a first signal-propagation time required for a rising edge of a signal to traverse a test circuit from a data input node of the test circuit to a data output node of the test circuit, the method comprising:
    a. providing sequential, alternating falling and rising signal transitions on the test-circuit data input node, thereby producing a corresponding series of alternating falling and rising signal transitions on the test circuit data output node; and
    b. developing a signal having a period proportional to the first signal propagation time, wherein the period is independent of a second signal propagation time required for a falling edge of the signal to traverse the test circuit from the data input node of the test circuit to the data output node of the test circuit.

11. The method of claim 10, further comprising averaging a number of the clock periods to provide an average clock period.

12. The method of claim 11, further comprising employing the average period to determine the first signal-propagation time required for a low-to-high signal transition to traverse the test circuit.

13. The method of claim 10, further comprising calculating a portion of the first signal propagation delay not associated with the test circuitry and subtracting the portion from the first signal propagation delay.

14. A method of measuring a first signal-propagation time required for a falling edge of a signal to traverse a test circuit from a data input node of the test circuit to a data output node of the test circuit, the method comprising:
    a. providing sequential, alternating rising and falling signal transitions on the test-circuit data input node, thereby producing a corresponding series of alternating rising and falling signal transitions on the test circuit data output node; and
    b. developing a signal having a period proportional to the first signal propagation time, wherein the period is independent of a second signal propagation time required for a rising edge of the signal to traverse the test circuit from the data input node of the test circuit to the data output node of the test circuit.

15. The method of claim 14, further comprising averaging a number of the clock periods to provide an average clock period.

16. The method of claim 15, further comprising employing the average period to determine the first signal-propagation time required for a high-to-low signal transition to traverse the test circuit.

17. The method of claim 14, further comprising calculating a portion of the first signal propagation delay not associated with the test circuitry and subtracting the portion from the first signal propagation delay.

* * * * *